US 6,699,594 B1

(12) United States Patent
Ishikawa et al.

(10) Patent No.: US 6,699,594 B1
(45) Date of Patent: Mar. 2, 2004

(54) ORGANIC ELECTROLUMINESCENT DEVICE

(75) Inventors: Hitoshi Ishikawa, Tokyo (JP); Satoru Toguchi, Tokyo (JP); Yukiko Morioka, Tokyo (JP); Atsushi Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 80 days.

(21) Appl. No.: 09/675,166

(22) Filed: Sep. 29, 2000

Related U.S. Application Data

(62) Division of application No. 09/327,509, filed on Jun. 8, 1999, now Pat. No. 6,465,116.

(30) Foreign Application Priority Data

| Jun. 8, 1998 | (JP) | 10-158938 |
| Aug. 3, 1998 | (JP) | 10-218905 |
| Oct. 5, 1998 | (JP) | 10-282828 |

(51) Int. Cl.[7] .............................................. H05B 33/12
(52) U.S. Cl. ........................ 428/690; 428/917; 313/504; 313/506
(58) Field of Search ................................ 428/690, 704, 428/917; 313/504, 506

(56) References Cited

U.S. PATENT DOCUMENTS

| 5,141,671 A | * | 8/1992 | Bryan et al. ........... 252/301.16 |
| 5,443,922 A | * | 8/1995 | Nishizaki et al. ........... 428/690 |
| 6,329,083 B1 | * | 12/2001 | Toguchi et al. ............. 428/690 |

FOREIGN PATENT DOCUMENTS

| JP | 2-288188 | 11/1990 |
| JP | 3-200289 | 9/1991 |
| JP | 4-6795 | 1/1992 |
| JP | 4-17294 | 1/1992 |
| JP | 4-55493 | 2/1992 |
| JP | 5-78655 | 3/1993 |
| JP | 7-138561 | 5/1995 |
| JP | 8-20771 | 1/1996 |
| JP | 8-40995 | 2/1996 |
| JP | 8-40997 | 2/1996 |
| JP | 8-48973 | 2/1996 |
| JP | 8-53397 | 2/1996 |
| JP | 8-87122 | 4/1996 |
| JP | 8-239655 | 9/1996 |
| JP | 9-255948 | 9/1997 |
| JP | 9-279134 | 10/1997 |
| JP | 10-25472 | 1/1998 |
| JP | 3005980 B2 | 11/1999 |

OTHER PUBLICATIONS

C.W. Tang et al., "Organic electroluminescent diodes," Applied Physics Letters, vol. 51, Sep. 21, 1987, pp. 913–915.

* cited by examiner

*Primary Examiner*—Marie Yamnitzky
(74) *Attorney, Agent, or Firm*—Sughrue Mion, PLLC

(57) ABSTRACT

An organic electroluminescent (EL) device includes one or more organic thin film layers disposed between an anode and a cathode, at least one of said layers containing, in a form of a mixture or a single substance, a dibenzoperylene compound expressed in Formula 4. The organic EL device exhibits higher luminance than that obtained by a conventional organic EL device.

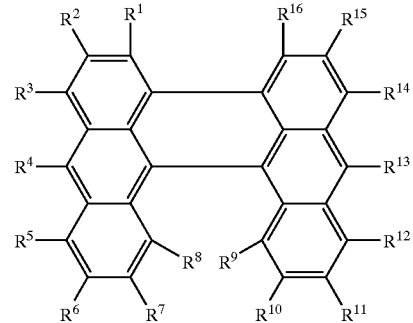

[Formula 4]

6 Claims, 2 Drawing Sheets

ORGANIC ELECTROLUMINESCENT DEVICE

This is a divisional of Application No. 09/327,509 filed Jun. 8, 1999, the disclosure of which is incorporated herein by reference, now U.S. Pat. No. 6,465,116.

BACKGROUND OF THE INVENTION (a) Field of the Invention

The present invention relates to an organic electroluminescent device having an excellent luminance property such as high luminance efficiency.

(b) Description of the Related Art

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device have been briskly carried out. Tang et al. reported an organic EL device using tris(8-hydroxyquinolinol aluminum) in a light-emitting layer and a triphenyldiamine derivative in a hole-transporting layer. This stacked structure gives such advantages as an improvement in the injection efficiency of holes into the light-emitting layer; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transporting material, triphenyl amine derivatives and aromatic diamine derivatives such as 4,4', 4"-tris(3-methylphenylphenylamino)-triphenyl amine which is a star burst molecule and N,N'-diphenyl-N,N'-bis(3-methylphenyl)-[1,1'-biphenyl]-4,4'-diamine are well known (for example, Patent Publications JP-A-8-20771, JP-A-8-40995, JP-A-8-40997, JP-A-8-53397, and JP-A-8-87122). As an electron transporting material, oxadiazole derivatives, triazole derivatives and the like are well known.

Chelate complexes such as tris(8-quinolinolate)aluminum complex, coumarin derivatives, tetraphenylbutadiene derivatives, bisstyrylarylene derivatives, oxadiazole derivatives and the like are known as light emitting materials. Since various color lights in a visible region from blue to red are obtained from these light-emitting materials, there is increased expectation for industrialization of a full color organic EL device (refer to, e.g., JP-A-8-239655, JP-A-7-138561, and JP-A-3-200289).

In recent days, organic EL devices with high brightness and long lifetime have been disclosed or reported, but these are not yet sufficient.

SUMMARY OF THE INVENTION

It is therefore an object of the present invention to provide materials for the organic EL devices having high luminance.

The inventors have found as a result of diligent investigation for overcoming the above problems that an organic EL device having a specific one of pentacene compounds and of dibenzoperylene compounds as a luminescent material has much higher luminance than a conventional EL device. The material has been found to have a high carrier transporting ability, and an organic EL device prepared by employing the above material as a hole transporting material or an electron transporting material and another organic EL device prepared by employing a mixed thin film comprising the material and another hole transporting material or electron transporting material has been found to have higher luminance than the conventional one.

It has been also found that an organic EL device prepared by employing, as a luminescent material, a hole transporting material or an electron transporting material, a pentacene compound and/or a dibenzoperylene compound, among the above pentacene and dibenzoperylene compounds, having a diarylamino group as a substituent exhibits an especially high luminance. It has been also found that an organic EL device prepared by employing, as a luminescent material, a hole transporting material or an electron transporting material, a pentacene compound and/or a dibenzoperylene compound, among the above pentacene and dibenzoperylene compounds, having a styryl group as an aryl group exhibits an especially high luminance. The present invention is based on these findings.

Thus, the present invention provides, in a first aspect thereof, an organic electroluminescent device comprising an anode, a cathode, and one or more organic thin film layers disposed between said anode and said cathode, at least one of said layers containing, in a form of a mixture or a single substance, a pentacene compound expressed in Formula 1.

[Formula 1]

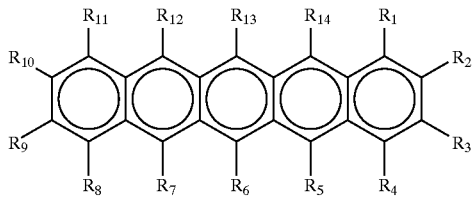

Wherein each of $R_1$ to $R_{14}$ independently represents a hydrogen atom, a halogen atom, a hydroxyl group, a substituted or non-substituted amino group, nitro group or cyano group, a substituted or non-substituted alkyl group, a substituted or non-substituted alkenyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxylcarbonyl group, or a carboxyl group. The substituents $R_1$ to $R_{14}$ may form a ring between two of them. At least one of $R_1$ to $R_{14}$ is a diarylamino group expressed by —$NAr_1Ar_2$ (each of $Ar_1$ and $Ar_2$ independently represents a substituted or non-substituted aryl group having 6 to 20 carbons, and at least one of these has a styryl group expressed in Formula 2 below and a ring may be formed between two of them.

[Formula 2]

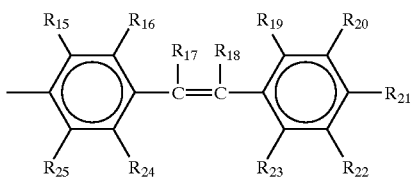

Wherein each of $R_{15}$ to $R_{25}$ independently represents a hydrogen atom, a halogen atom, a hydroxyl group, a substituted or non-substituted amino group, nitro group- or cyano group, a substituted or non-substituted alkyl group, a substituted or non-substituted alkenyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxylcarbonyl group, or a carboxyl group. The substituents $R_{15}$ to $R_{25}$ may form a ring between two of them.

The present invention further provides, in a second aspect thereof, an organic electroluminescent device employing a compound expressed in Formula 3 in place of that expressed in Formula 1 of the first aspects.

The present invention further provides, in a third aspect thereof, an organic electroluminescent device employing a compound expressed in Formula 4 in place of that expressed in Formula 1 of the first aspect.

[Formula 3]

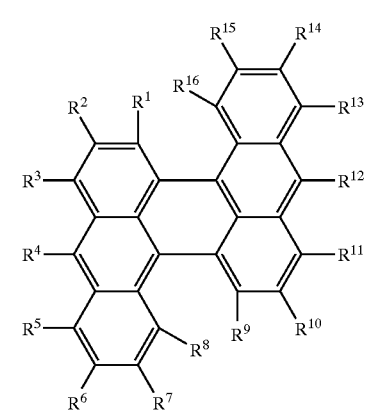

[Formula 4]

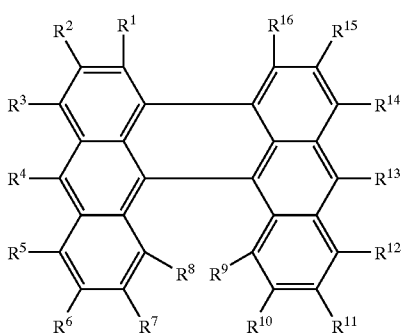

In accordance with the present invention, the organic EL device effectively exhibits higher luminance than that obtained by a conventional organic EL device by employing the specified pentacene or dibenzopeylene compound.

The above and other objects, features and advantages of the present invention will be more apparent from the following description.

PREFERRED EMBODIMENTS OF THE INVENTION

Figure 1:
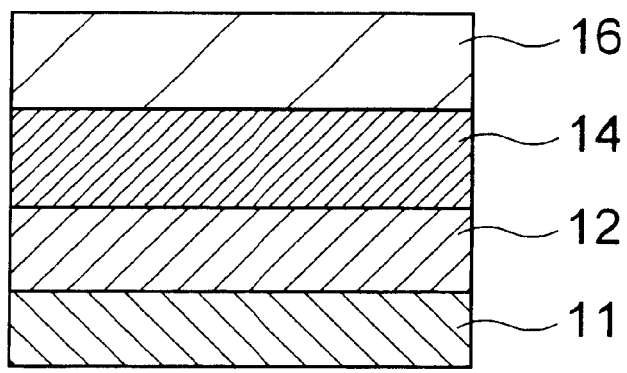
FIG. 1 is a sectional view of one example of an organic EL device in accordance with the present invention.

The pentacene compound employed in the first aspect of the resent invention is that having a structural formula expressed in above Formula 1. In Formulae 1 and 2, each of $R_1$ to $R_{14}$ and $R_{15}$ to $R_{25}$ independently represents a hydrogen atom, a halogen atom, a hydroxyl group, a substituted or non-substituted amino group, nitro group or cyano group, a substituted or non-substituted alkyl group, a substituted or non-substituted alkenyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxylcarbonyl group, or a carboxyl group. The substituents $R_1$ to $R_{14}$ and/or $R_{15}$ to $R_{25}$ may form a ring between two of them.

Fluorine, chlorine, bromine and iodine may be selected as the halogen atom.

The substituted or non-substituted amino group is expressed as $-NX_1X_2$, examples of $X_1$ and $X_2$ independently include a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinirtroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group;, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1, 9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline -5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline -9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4- phenothiazinyl group, 1-phenoxazinyl group, 2- phenoxazinyl group, 3-phenoxazinyl group, 4- phenoxazinyl group, 2-oxazolyl group, 4-oxazolyl group, 5-oxazolyl group, 2-oxadiazolyl group, 5-oxadiazolyl group, 3-hurazanyl group, 2 thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl-1-indolyl group, 2-t-butyl-3-indolyl group, and 4-t-butyl-3-indolyl group.

Examples of the substituted or non-substituted alkyl group include methyl group, ethyl group, propyl group, isopropyl group, n-butyl, s-butyl, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoehtyl group, 1,3-dicyanoisopropy group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or non-substituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or non-substituted cycloalkyl group include cyclopropyl group, cyclobutyl group, cyclopentyl group, cyclohexyl group, and 4-methylcyclohexyl group.

The substituted or non-substituted alkoxy group is represented by —OY and examples of Y include methyl group, ethyl group, propyl group, isopropyl group, n-butyl group, s-butyl group, isobutyl group, t-butyl group, n-pentyl group, n-hexyl group, n-heptyl group, n-octyl group, 18-hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group. 4-methyl-1-naphthyl group, 4-methyl-1-anthryl group, 4'-methylbiphenylyl group and 4"t-butyl-p-terphenyl-4-yl group.

Examples of the substituted or non-substituted aromatic heterocyclic group include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl, group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group,->1,9-phenanthrolin-10-yl group, 1,10-phenanthrolin-2-yl group, 1,10-phenanthrolin-3-yl group, 1, 10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl groups 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or non-substituted aralkyl group include benzyl group, 1-phenylethyl group, 2-phenylethyl group, 1-phenylisopropyl group, 2-phenylisopropyl group, phenyl-t-butyl group, α-naphthylmethyl group, 1- ct-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or non-substituted aryloxy group is represented by —OZ, wherein Z may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group; 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phe nanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methyl-1-pyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butylI-indolyl group, 4-t-butylI-indolyl group, 2-t-butyl-3-indolyl group and 4-t-butyl-3-indolyl group.

The substituted or non-substituted alkoxycarbonyl group is represented by —COOY, wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromorethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of bivalent groups forming a ring include tetramethylene group, pentamethylene group, hexamethylene group, diphenylmethan-2,2'-diyl group, diphenylethan-3,3'-diyl group and diphenylpropan-4,4'-diyl group.

In the compound represented by the above Formula 1, at least one of $R_1$ to $R_{14}$ is a diarylamino group expressed by —$NAr_1Ar_2$ (each of $Ar_1$ and $Ar_2$ independently represents a substituted or non-substituted aryl group having 6 to 20 carbons wherein at least one of them has a styryl group expressed by the above Formula 2 and may form a ring.

In the styryl group expressed by the above Formula 2, examples of the aryl group having 6 to 20 carbons include phenyl group, naphthyl group, anthryl group, phenanthryl group, naphthacenyl group, and pyrenyl group. Examples of a substituent of the aryl group include a halogen atom, hydroxyl group, the above substituted or non-substituted amino group, nitro group or cyano group, the above substituted or non-substituted alkyl group, the above substituted or non-substituted alkenyl group, the above substituted or non-substituted cycloalkyl group, the above substituted or non-substituted alkoxyl group, the above substituted or non-substituted aromatic hydrocarbon group, the above substituted or non-substituted aromatic heterocyclic group, the above substituted or non-substituted aralkyl group, the above substituted or non-substituted aryloxy group, the above substituted or non-substituted alkoxycarbonyl group and carboxyl group.

Examples of the styryl group which $Ar_1$ and $Ar_2$ have as a substituent include non-substituted styryl group and 2,2'-diphenylvinyl group. In addition, the substituted styryl group having, as a substituent of a terminal phenyl group, a halogen atom, hydroxyl group, the above substituted or non-substituted amino group, nitro group or cyano group, the above substituted or non-substituted alkyl group, the above substituted or non-substituted alkenyl group, the above substituted or non-substituted cycloalkyl group, the above substituted or non-substituted alkoxyl group, the above substituted or non-substituted aromatic hydrocarbon group, the above substituted or non-substituted aromatic heterocyclic group, the above substituted or non-substituted aralkyl group, the above substituted or non-substituted aryloxy group, the above substituted or non-substituted alkoxycarbonyl group and carboxyl group as well as substituted 2,2'-diphenylvinyl group can be employed.

Examples of the pentacene compounds employed in the present invention include, but not limited thereto, compounds shown in Formulae 5 to 10.

[Formula 5]

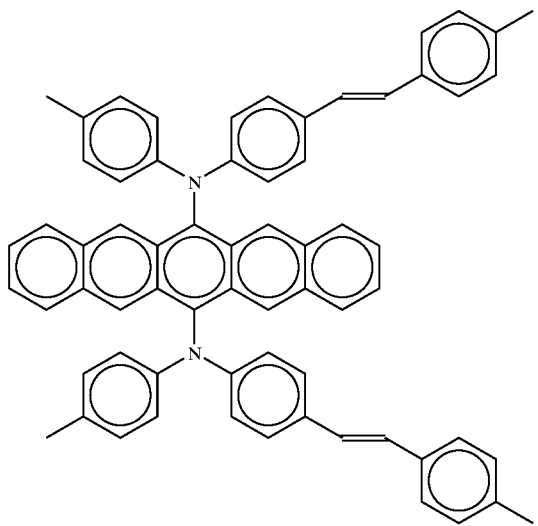

[Formula 6]

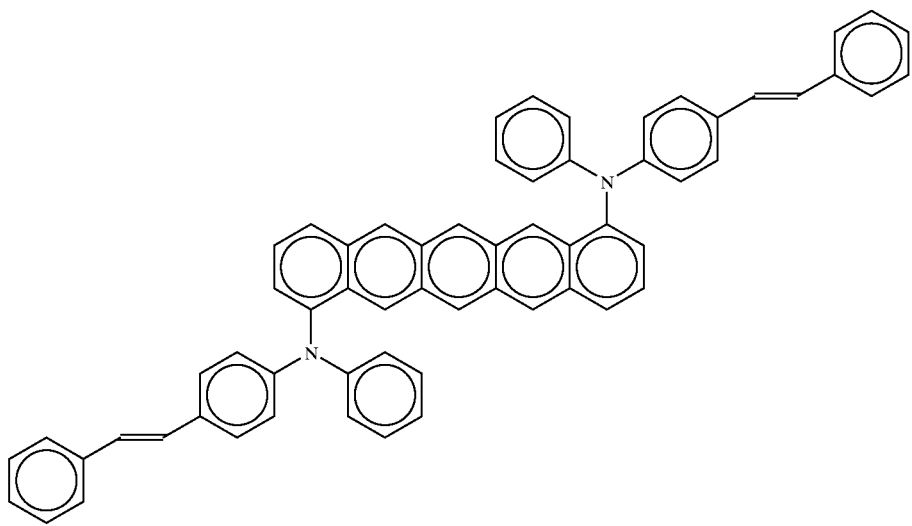

[Formula 7]
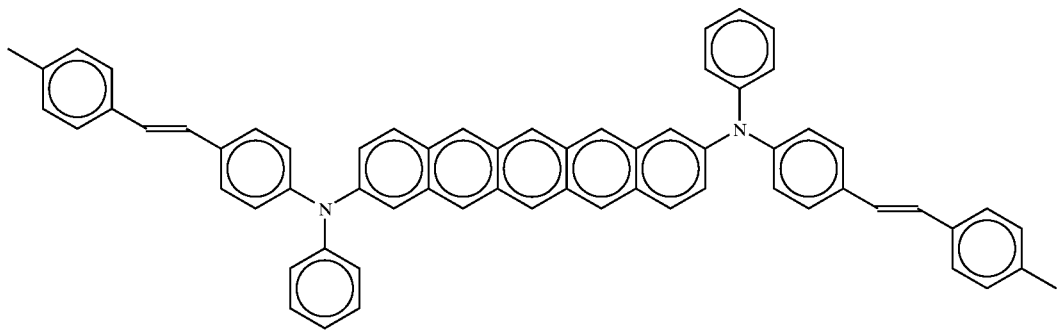
[Formula 8]
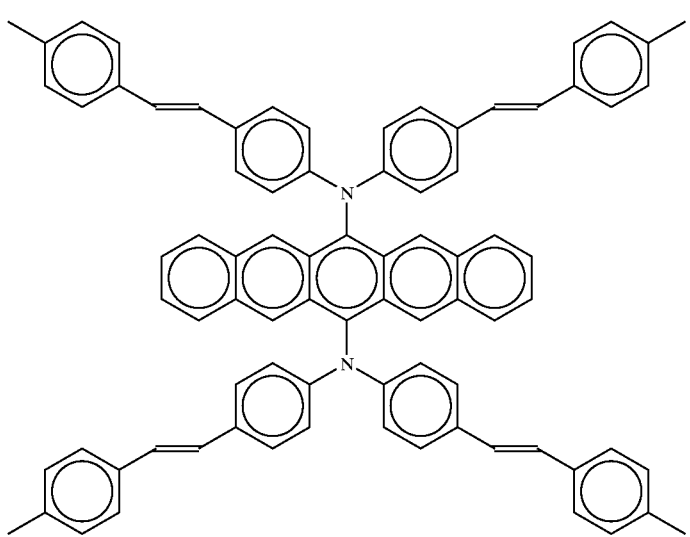
[Formula 9]
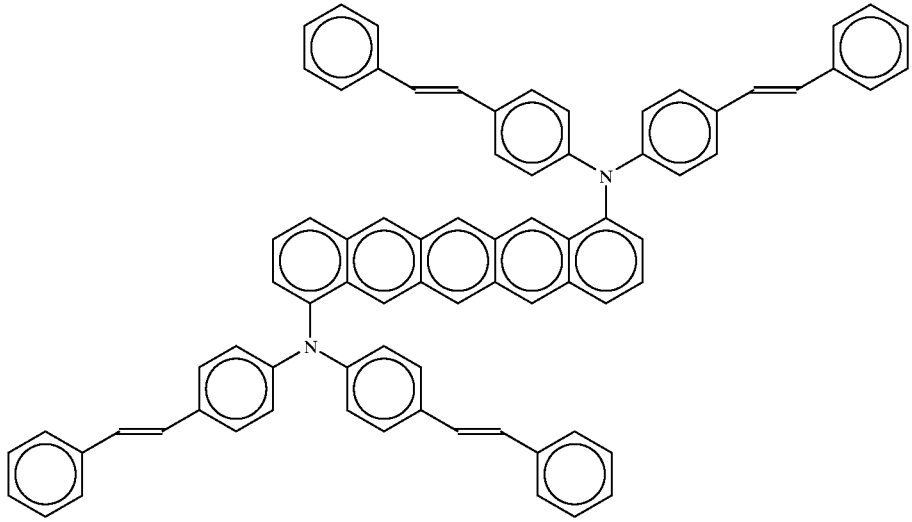

-continued

[Formula 10]

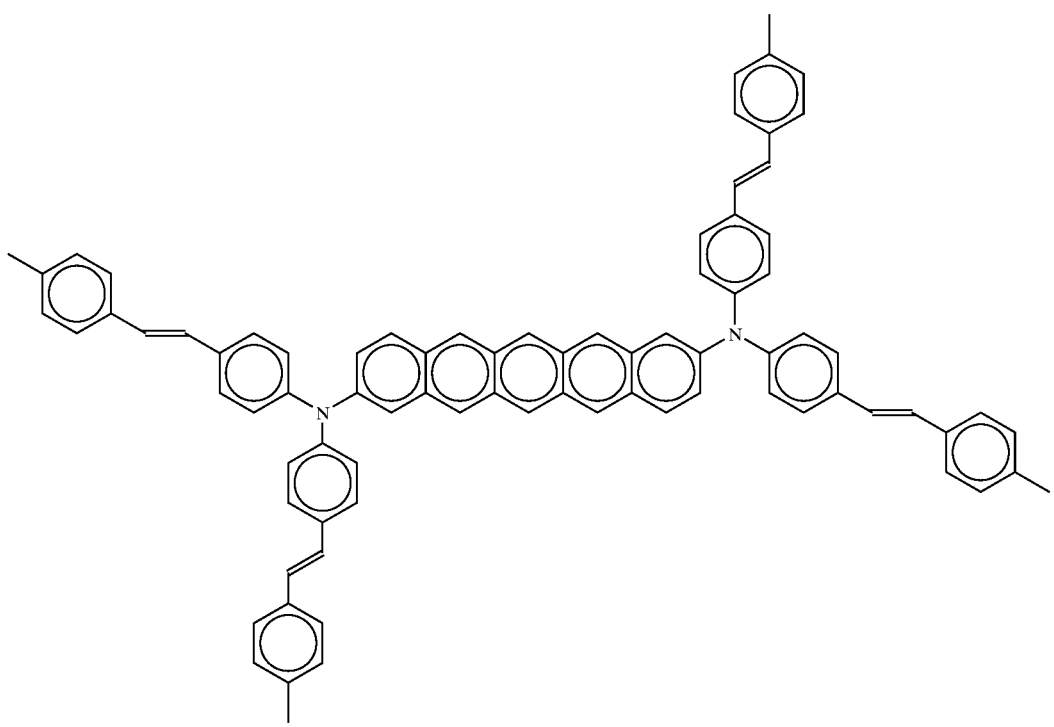

Figure 2:
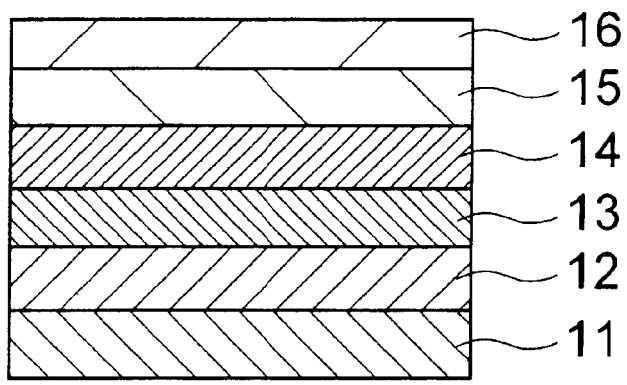
FIG. 2 is a sectional view of another example of an organic EL device.
Figure 3:
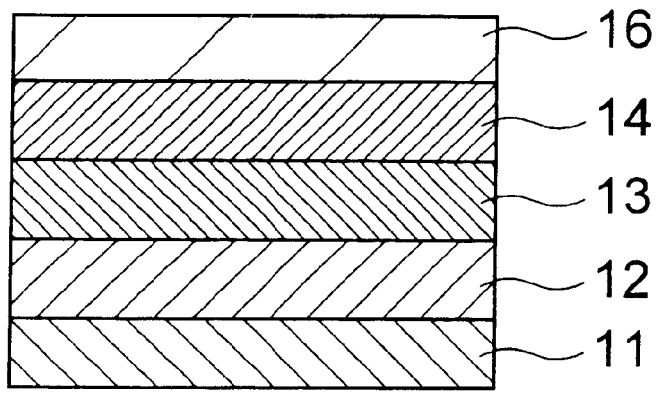
FIG. 3 is a sectional view of a further example of an organic EL device.
Figure 4:
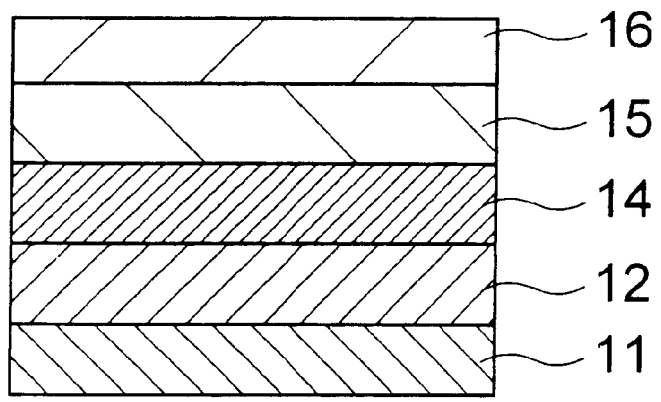
FIG. 4 is a sectional view of a still further example of an organic EL device.

A structure of the organic EL device of the present invention is a stacked structure having one or more organic layers between an anode and a cathode. Examples thereof are shown in FIGS. 1 to 4. In FIG. 1, a stacked structure consisting of an anode 12, a luminescent layer 14 and a cathode 16 in this order stacked on a substrate 11 is illustrated. In FIG. 2, another stacked structure consisting of an anode 12, a hole transporting layer 13, a luminescent layer 14, an electron transporting layer 15 and a cathode 16 in this order stacked on a substrate 11 is illustrated. In FIG. 3, a further stacked structure consisting of an anode 12, a hole transporting layer 13, a luminescent layer 14 and a cathode 16 stacked in this order on a substrate 11 is illustrated. In FIG. 4, a still further stacked structure consisting of an anode 12, a luminescent layer 14, an electron transporting layer 15 and a cathode 16 stacked in this order on a substrate 11 is illustrated.

The above-mentioned pentacene compounds may be included in any one of the organic layers, and may be doped in the hole transporting material, the luminescent material or the electron transporting material.

The hole transporting material employed in the present invention is not especially restricted, and any compound ordinarily used as the hole transporting material can be employed. Examples of the hole transporting material include triphenyldiamines such as bis(di(p-tolyl) aminophenyl)-1,1-cyclohexane (Formula 11), N,N'-biphenyl-4,4'-diamine (Formula 12) and N,N'-diphenyl-N, N'-bis(1-naphthyl)-1,1'-biphenyl-4,4'-diamine (Formula 13), and star burst type molecules formulae 14 to 16).

[Formula 11]

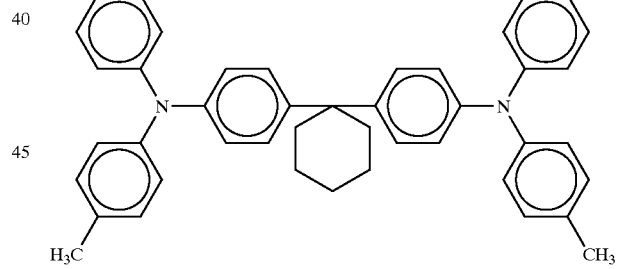

[Formula 12]

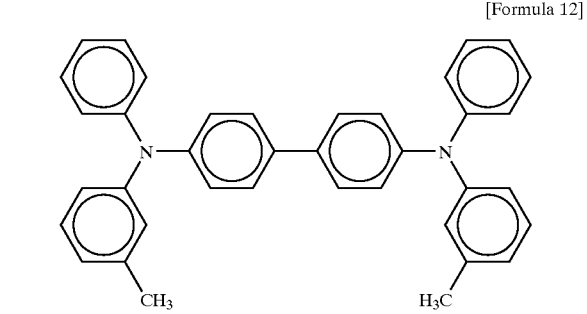

[Formula 13]

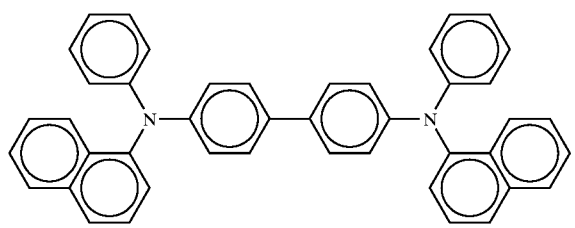

[Formula 15]

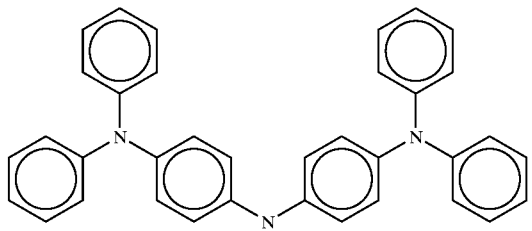

[Formula 14]

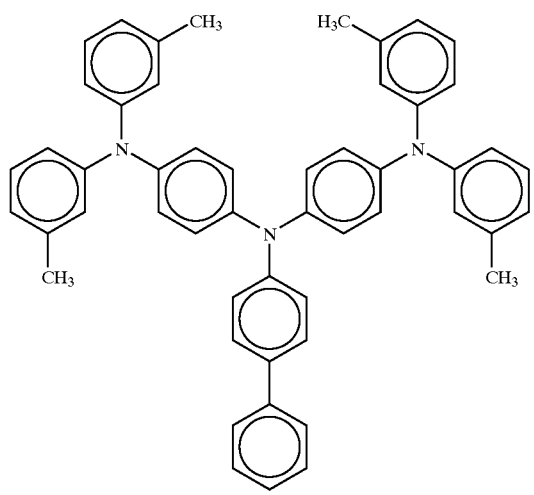

[Formula 16]

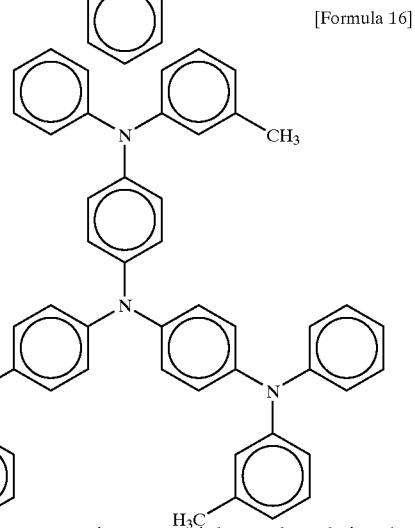

The electron transporting material employed in the present invention is not especially restricted, and any compound ordinarily used as the electron transporting material can be employed. Examples of the electron transporting material include oxadiazole derivatives such as 2-(4-biphenylyl)-5-(4-t-butylphenyl)-1,3,4-oxadiazole (Formula 17) and bis[2-(4-t-butylphenyl)-1,3,4-oxadiazol]-m-phenylene (Formula 18), triazole derivatives (Formulae 19 and 20) and quinolinol-based metal complexes (Formulae 21 to 24).

[Formula 17]

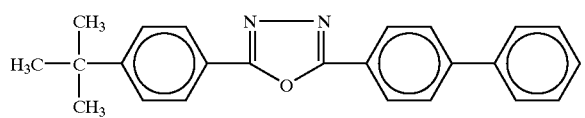

[Formula 18]

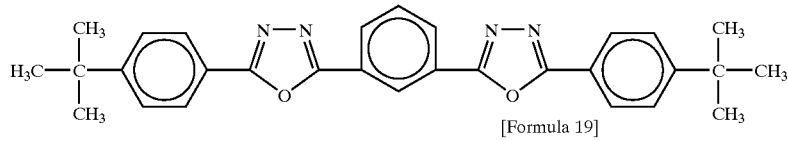

[Formula 19]

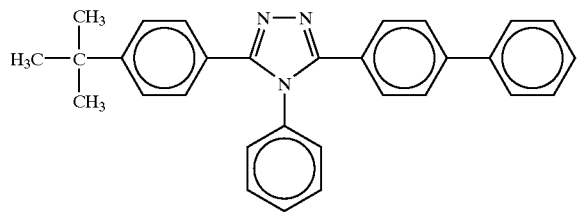

[Formula 20]

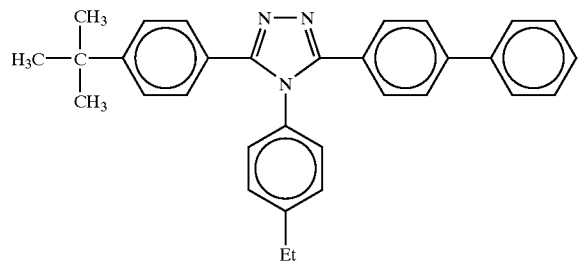

-continued

[Formula 21]

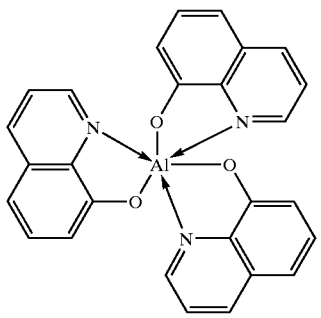

[Formula 22]

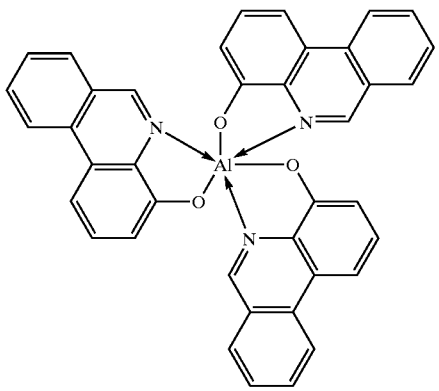

[Formula 23]

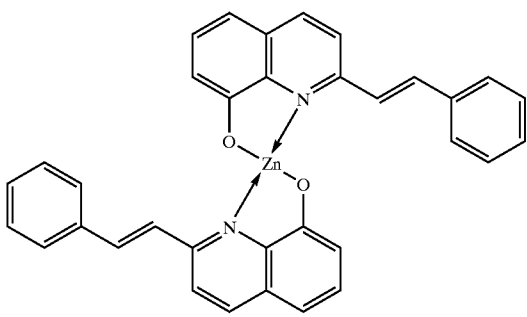

[Formula 24]

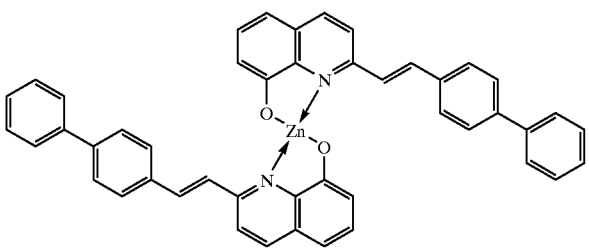

The anode of the organic thin film EL device has a role of injecting holes into the hole transporting layers, and effectively has a work function of 4.5 eV or more. Examples of the anode material employed in the present invention include an indium oxide-tin alloy (ITO), tin oxide (NESA), gold, silver, platinum and copper. The cathode has a role of injecting electrons into the electron transporting layers and/or the luminescent layers, and preferably has a small work function. The cathode material is not especially restricted, and indium, aluminum, magnesium, a magnesium-indium alloy, a magnesium-aluminum alloy, an aluminum-lithium alloy, an aluminum-scandium-lithium alloy or a magnesium-silver alloy may be employed.

A method of forming the respective layers of the organic EL device of the present invention is not especially restricted, and any one of known methods such as a vacuum vapor deposition method and a spin coating method may be employed. The organic thin film layer containing the compound expressed in Formula 1 can be formed by an application method such as a vacuum vapor deposition method, a molecular beam evaporation method (MBE method), a dipping method employing a solution prepared by dissolving the material in a solvent, a spin coating method, a casting method, a bar coating method and a roll coating method.

Although the thickness of the respective organic layers of the organic device in accordance with the present invention is not especially restricted, it is ordinarily in a range between several nm and 1 micronmeter. If the thickness is excessively thin, such a defect as a pin hole is likely produced, and on the other hand if it is excessively thick, a high applied voltage is required to make its efficiency worse.

The dibenzoperylene compounds employed in the second and third aspects of the resent invention are those having structural formulae expressed in above Formulae 3 and 4, respectively. In Formulae 3 and 4, each of $R^1$ to $R^{16}$ independently represents the same atom or substituent as that shown in connection with $R_1$ to $R_{14}$ and $R_{15}$ to $R_{25}$ of Formulae 1 and 2. In Formulae 3 and 4, at least one of $R^1$ to $R^{16}$ is preferably a diarylamino group expressed by —$NAr_1Ar_2$ Each of $Ar_1$ and $Ar_2$ independently represents a substituted or non-substituted aryl group having 6 to 20 carbons, and at least one of these may have a substituted or non-substituted styryl group as a substituent.

Examples of the dibenzoperylene compounds employed in Formula 3 include, but not limited thereto, compounds shown in Formulae 25 to 30.

[Formula 25]

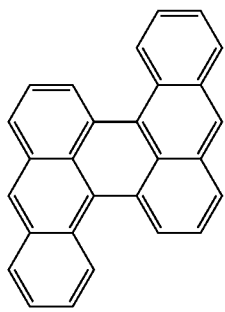

[Formula 26]
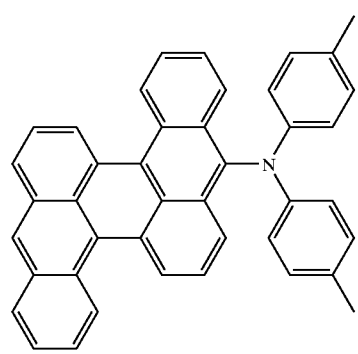
[Formula 27]
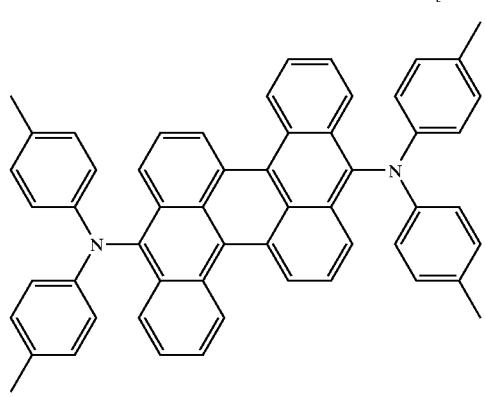
[Formula 28]
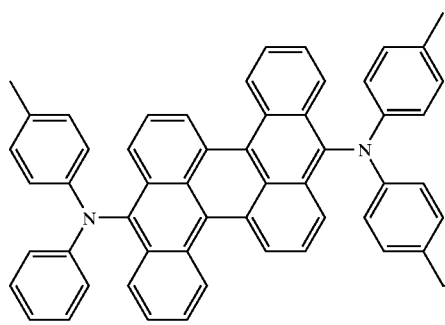
[Formula 29]
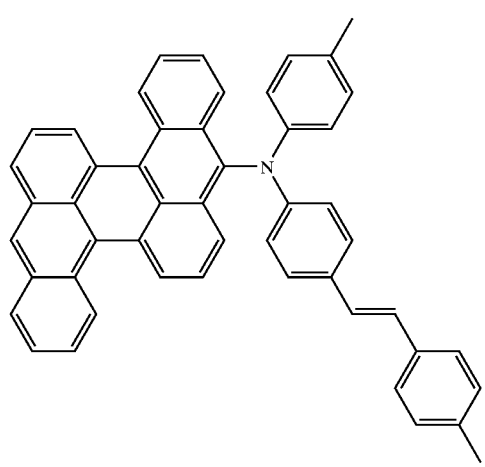
[Formula 30]
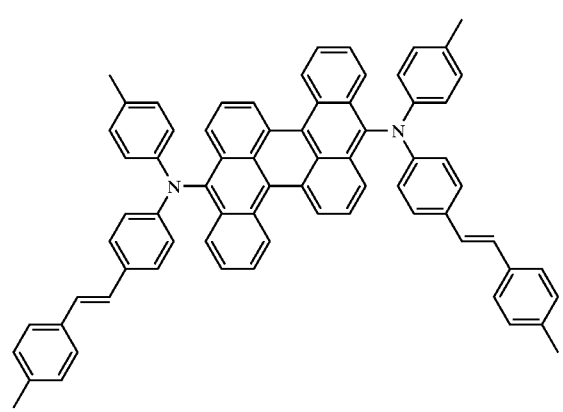
Examples of the dibenzoperylene compounds employed in Formula 4 include, but not limited thereto, compounds shown in Formulae 31 to 36.
[Formula 31]
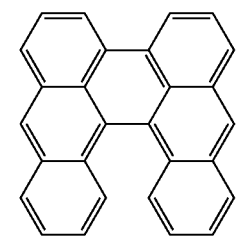
[Formula 32]
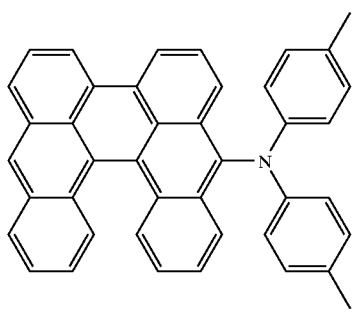
[Formula 33]
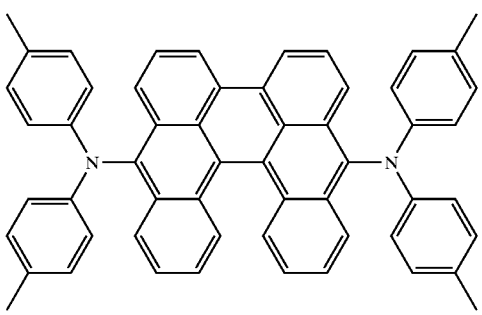

-continued

[Formula 34]

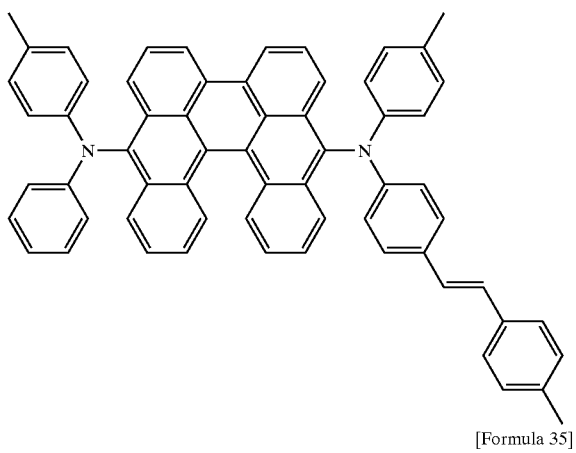

[Formula 35]

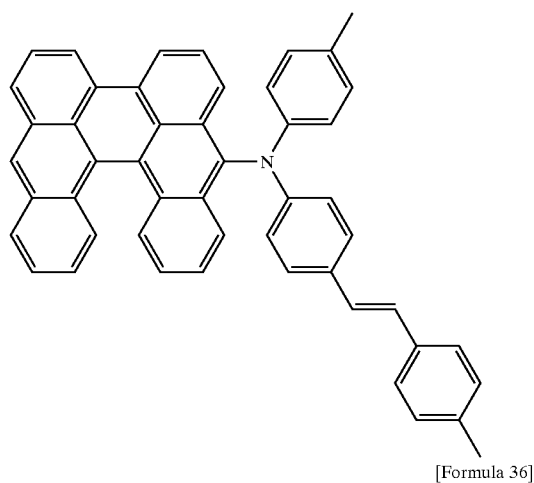

[Formula 36]

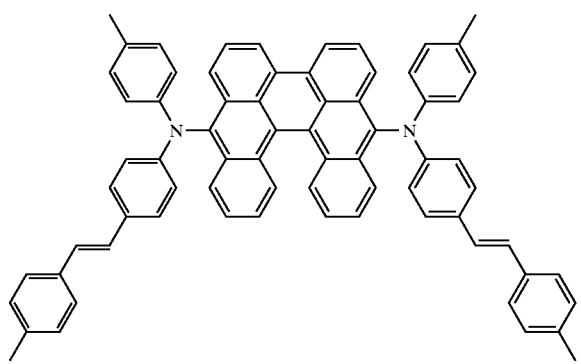

EXAMPLES

Although the present invention will be more fully described in accordance with below Examples, the present invention shall not be restricted thereto.

Synthesis Example 1

Synthesis of 6,13-bis(4-(4-Methylstyryl)phenyl-p-tolylaimino)pentacene (Formula 5)

6,1,3-dibromopentacene, 4-methyldiphenyl-amine, potassium carbonate, and copper powder were stirred in nitrobenzene for 30 hours at 200° C. After the reaction solution was filtered to remove inorganic compounds, nitrobenzene was removed by distillation in a reduced pressure ambient, and the remainder was refined in accordance with an ordinary method to obtain 6,13-bis(4-methyldiphenylamino) pentacene. Then, 6,13-bis(4-methyldiphenylamino) pentacene was reacted with phosphoryl trichloride for 5 hours at 50° C. to obtain 6,13-bis(4-formyl-4'-methyldiphenylamino) pentacene. After then, 6,13-bis(4-formyl-4'-methyldiphenylamino)pentacene was reacted with diethyl 4-methylbenzylphosphonate and sodium hydride in dimethylsulfoxide for an hour at 50° C. to obtain 6,13-bis(4-(4-methylstyryl)phenyl-p-tolylamino)pentacene.

Synthesis Example 2

Synthesis of Dibenzo[a,j]perylene (Formula 25)

After 8,16-dioxo-8,16-dihydroxydibenzo-[a,j]perylene was reacted with zinc powder, pyridine and acetic acid in accordance with an ordinary method, the reaction product was refined to obtain target dibenzo[a,j]perylene.

Synthesis Example 3

Synthesis of 8-(di-p-Tolylamino)dibenzo [a,j] perylene (Formula 26)

After dibenzo[a,j]perylene dissolved in carbon tetrachloride was brominated with cooling for four hours by adding one molar equivalent of bromine, the reaction product was refined in accordance with an ordinary method to obtain 8-bromodibenzo-[a,j]perylene. Di-p-tolylamine, potassium carbonate and copper powder were added to the thus obtained 8-bromodibenzo[a,j]perylene and were allowed to react for 30 hours at 200° C. After the reaction solution was diluted with water, the reaction product was extracted with chloroform. Thereafter, it was refined in accordance with an ordinary method to obtain a target compound expressed in Formula 26.

Synthesis Example 4

Synthesis of 8,16-(bis(di-p-Tolylamino))dibenzo[a,j] perylene (Formula 27)

After dibenzo[a,j]perylene dissolved in carbon tetrachloride was brominated with cooling by adding two molar equivalents of bromine, the reaction product was refined in accordance with an ordinary method to obtain 8,16-dibromodibenzo-[a,j]perylene. Two molar equivalents of di-p-tolylamine, potassium carbonate and copper powder were added to the thus obtained 8,16-dibromodibenzo[a,j]perylene and were allowed to react for 30 hours at 200° C. After the reaction solution was diluted with water, the reaction product was extracted with chloroform. Thereafter, it was refined in accordance with an ordinary method to obtain a target compound expressed in Formula 27.

Synthesis Example 5

Synthesis of 8-(N-4-(4-Methylphenylvinyl)-phenyl-N-p-tolylamino)-16-(N-phenyl-N-p-tolylamino) dibenzo [a,j]perylene (Formula 28)

In accordance with the procedure of Synthesis Example 4 except that phenyl-p-tolylamine was employed in place of di-p-tolylamine, 8,16-(bis(N-phenyl-N-p-tolylamino)) dibenzo[a,j]perylene was obtained. This compound was dissolved in toluene, and agitated at room temperature after one molar equivalent of phosphoryl trichloride was added. N-methylformanilide was added dropwise to this solution and was agitated for five hours at 50° C.

Upon completion of the reaction, cold water was added thereto and the reaction mixture was transferred into a separatory funnel. The toluene layer was washed with water several times until it became neutral. After it was dried with magnesium sulfate and the solvent was removed, the reaction product was refined in accordance with an ordinary method to obtain 8-(N-p-formylphenyl-N-p-tolylamino)-16-(N-phenyl-N-p-tolylamino)dibenzo-[a,j]perylene. This compound was reacted with diethyl p-methylbenzylphosphonate and sodium hydride in dimethylsulphoxide for 24 hours. After the reaction liquid was poured into ice water, the reaction product was extracted with chloroform. Thereafter, it was refined in accordance with an ordinary method to obtain a target compound expressed in Formula 28.

Synthesis Example 6

Synthesis of 8-(N-4-(4-Methylphenylvinyl)-phenyl-N-p-tolylamino)dibenzo[a,j]perylene (Formula 29)

In accordance with the procedure of Synthesis Example 5 except that 8-bromodibenzo[a,j]perylene was employed in place of 8,16-dibromodibenzo-[a,j]perylene, and one molar equivalent of phenyl-p-tolylamine was employed, a target compound expressed in Formula 29 was obtained.

Synthesis Example 7

Synthesis of 8,16-bis(N-4-(4-Methylphenyl-vinyl)-phenyl-N-p1-tolylamino)dibenzo[a,j] perylene (Formula 30)

In accordance with the procedure of Synthesis Example 5 except that two molar equivalents of phosphorus oxychloride was employed, a target compound expressed in Formula 30 was obtained.

Synthesis Example 8

Synthesis of Dibenzo[a,o]perylene (Formula 31)

After hydrochloric acid was added to an acetic acid solution of anthrone, it was refluxed upon addition of zinc. Thereafter it was refined in accordance with an ordinary method to obtain 9,9'-bianthryl. After it was added little by little to a melt of aluminum chloride and sodium chloride, the reaction mixture was poured into diluted hydrochloric acid and a solids constituent was collected. The solids constituent thus obtained was refined in accordance with an ordinary method to obtain target dibenzo[a,o]perylene.

Synthesis Example 9

Synthesis of 7-(di-p-Tolylamino)dibenzo[a,o] perylene (Formula 32)

After dibenzo[a,o]perylene dissolved in carbon tetrachloride was brominated with cooling for four hours by adding one molar equivalent of bromine, the reaction product was refined in accordance with an ordinary method to obtain 7-bromodibenzo-[a,o]perylene. Di-p-tolylamine, potassium carbonate and copper powder were added to the thus obtained 7-bromodibenzo[a,o]perylene and were allowed to react for 30 hours at 200° C. After the reaction solution was diluted with water, the reaction product was extracted with chloroform. Thereafter, it was refined in accordance with an ordinary method to obtain a target compound expressed in Formula 32.

Synthesis Example 10

Synthesis of 7,16-(bis(di-p-Tolylamino))dibenzo[a, o]perylene (Formula 33)

After dibenzo[a,o]perylene dissolved in carbon tetrachloride was brominated with cooling by adding two molar equivalents of bromine, the reaction product was refined in accordance with an ordinary method to obtain 7,16-dibromodibenzo-[a,o]perylene. Two molar equivalents of di-p-tolylamine, potassium carbonate and copper powder were added to the thus obtained 7,16-dibromodibenzo[a,o]perylene and were allowed to react for 30 hours at 200° C. After the reaction solution was diluted with water, the reaction product was extracted with chloroform. Thereafter, it was refined in accordance with an ordinary method to obtain a target compound expressed in Formula 33.

Synthesis Example 11

Synthesis of 7-(N-4-(4-Methylphenylvinyl)-phenyl-N-p-tolylamino)-16-(N-phenyl-N-p-tolylamino) dibenzo[a,o]perylene (Formula 34)

In accordance with the procedure of Synthesis Example 10 except that phenyl-p-tolylamine was employed in place of di-p-tolylamine, 7,16-(bis(N-phenyl-N-p-tolylamino)) dibenzo[a,o]perylene was obtained. This compound was dissolved in toluene, and agitated at room temperature after one molar equivalent of phosphoryl trichloride was added. N-methylformanilide was added dropwise to this solution and was agitated for five hours at 50° C. Upon completion of the reaction, cold water was gradually added thereto and the reaction mixture was transferred into a separatory funnel. The toluene layer was washed with water several times until it became neutral. After it was dried with magnesium sulfate and the solvent was removed, the reaction product was refined in accordance with an ordinary method to obtain 7-(N-p-formylphenyl-N-p-tolylamino)-16-(N-phenyl-N-p-tolylamino)dibenzo-[a,o]perylene. This compound, diethyl p-methylbenzylphosphonate and sodium hydride were allowed to react in dimethylsulphoxide for 24 hours. After the reaction liquid was poured into ice water, the reaction product was extracted with chloroform. Thereafter, it was refined in accordance with an ordinary method to obtain a target compound expressed in Formula 34.

Synthesis Example 12

Synthesis of 7-(N-4-(4-Methylphenylvinyl)-phenyl-N-p-tolylamino)dibenzo[a,o]perylene (Formula 35)

In accordance with the procedure of Synthesis Example 11 except that 8-bromodibenzo[a,o]perylene was employed in place of 7,16-dibromodibenzo-[a,o]perylene, and one molar equivalent of phenyl-p-tolylamine was employed, a target compound expressed in Formula 35 was obtained.

Synthesis Example 13

Synthesis of 7,16-bis(N-4-(4-Methylphenyl-vinyl)-phenyl-N-p-tolylamino)dibenzo[a,o]perylene (Formula 36)

In accordance with the procedure of Synthesis Example 11 except that two molar equivalents of phosphoryl trichloride was employed, a target compound expressed in Formula 36 was obtained.

Examples of employing, as a luminescent layer, a compound of the present invention are shown in Examples 1 to 11,27 to 42 and 53 to 68, those of employing, as a luminescent layer, a mixed film of a compound of the present invention with a hole transporting layer are shown in Examples 12 to 14, 43 to 46 and 69 to 72, those of employing, as a luminescent layer, a mixed film of a compound of the present invention with an electron transporting layer are shown in Examples 15 to 17, 47 to 49 and 73 to 75, those of employing, as a hole transporting layer, a compound of the present invention are shown in Examples 18 to 21, 50, 51, 76 and 77, and those of employing, as an electron transporting layer, a compound of the present invention are shown in Examples 22 to 26, 52, and 78.

Example 1

A sectional structure of a device employed in Example 1 is shown in FIG. 1. A procedure of manufacturing an organic thin film EL device employed in Example 1 will be described.

The device is composed of an anode 12, a luminescent layer 14 and a cathode 16. A film made of ITO was so sputtered on a glass substrate 11 that a sheet resistance became to 20 $\Omega/\square$ to make the anode 12. The compound expressed in Formula 5 was formed as the luminescent layer 14 on the anode 12 by employing a vacuum vapor deposition method by 40 nm. Then, a magnesium-silver alloy was formed as the cathode by employing the vacuum vapor deposition method by 200 nm to manufacture an organic EL device. When a direct voltage of 5V was applied to this device, the luminance of 20 cd/m$^2$ was obtained.

Example 2

Another organic EL device was manufactured in accordance with the same procedure of Example 1 except that the compound expressed in Formula 6 was employed. When a direct voltage of 5V was applied to this device, the luminance of 100 cd/m$^2$ was obtained.

Example 3

A further organic EL device was manufactured in accordance with the same procedure of Example 1 except that the compound expressed in Formula 7 was employed. When a direct voltage of 5V was applied to this device, the luminance of 110 cd/m$^2$ was obtained.

Example 4

A still further organic EL device was manufactured in accordance with the same procedure of Example 1 except that the compound expressed in Formula 8 was employed. When a direct voltage of 5V was applied to this device, the luminance of 400 cd/m$^2$ was obtained.

Example 5

A still further organic EL device was manufactured in accordance with the same procedure of Example 1 except that the compound expressed in Formula 9 was employed. When a direct voltage of 5V was applied to this device, the luminance of 600 cd/m$^2$ was obtained.

Example 6

A film made of ITO was so sputtered on a glass substrate 11 that a sheet resistance became to 20 $\Omega/\square$ to make the anode. The compound expressed in Formula 5 is formed as the luminescent layer on the anode by 40 nm by means of a spin coating method by employing a chloroform solution of the above compound. Then, a magnesium-silver alloy was formed as the cathode by employing the vacuum vapor deposition method by 200 nm to manufacture an organic EL device. When a direct voltage of 5V was applied to this device, the luminance of 120 cd/m$^2$ was obtained.

Example 7

A sectional structure of a device employed in Example 7 is shown in FIG. 2. The device is composed of an anode 12, a hole transporting layer 13, a luminescent layer 14, an electron transporting layer 15 and a cathode 16. A film made of ITO was so sputtered on a glass substrate 11 that a sheet resistance became to 20 $\Omega/\square$ to make the anode 12. On the anode, N,N'-diphenyl-N,N'-bis(3-methylphenyl)-[1,1'-biphenyl]-4,4'-diamine (Formula 12) was formed as the hole transporting layer by employing a vacuum vapor deposition method by 50 nm. Then, the compound expressed in Formula 5 was formed as the luminescent layer by employing the vacuum vapor deposition method by 40 nm thereon. Then, 2-(4-biphenyly)-5-(4-t-butylphenyl)-1,3,4-oxzadiazole (Formula 17) was formed as the electron transporting layer by employing the vacuum vapor deposition method by 20 nm thereon. Then, an magnesium-silver alloy was formed thereon as the cathode by employing the vacuum vapor deposition method by 200 nm to manufacture an organic EL device. When a direct voltage of 10V was applied to this device, the luminance of 800 cd/m$^2$ was obtained.

Example 8

Another organic EL device was manufactured in accordance with the same procedure of Example 7 except that the compound expressed in Formula 6 was employed in place of that expressed in Formula 5. When a direct voltage of 10V was applied to this device, the luminance of 1800 cd/m$^2$ was obtained.

Example 9

A further organic EL device was manufactured in accordance with the same procedure of Example 7 except that N,N'-diphenyl-N,N'-bis(1-naphthyl)-1,1'-biphenyl-4,4'-diamine (Formula 13) was formed as the hole transporting layer and bis[2-(4-t-butylphenyl)-1,3,4-oxadiazol]-m-phenylene (Formula 18) was formed as the electron transporting layer. When a direct voltage of 10V was applied to this device, the luminance of 1300 cd/m$^2$ was obtained.

Example 10

A still further organic EL device was manufactured in accordance with the same procedure of Example 7 except that the compound expressed in Formula 14 was employed as the hole transporting layer and the compound expressed in Formula 21 was employed as the electron transporting layer. When a direct voltage of 10V was applied to this device, the luminance of 2000 cd/m$^2$ was obtained.

Example 11

A still further organic EL device was manufactured in accordance with the same procedure of Example 7 except that the compound expressed in Formula 15 was employed as the hole transporting layer and the compound expressed in Formula 22 was employed as the electron transporting layer. When a direct voltage of 10V was applied to this device, the luminance of 6000 cd/m$^2$ was obtained.

Example 12

A sectional structure of a device employed in Example 12 is shown in FIG. 4. The device is composed of an anode 12, a luminescent layer 14, an electron transporting layer 15 and a cathode 16. A film made of ITO was so sputtered on a glass substrate 11 that a sheet resistance became to 20 $\Omega/\square$ to make the anode 12. On the anode, a mixed thin film made of N,N'-diphenyl-N,N'-bis(1-naphthyl)-1,1'-biphenyl-4,4'-diamine (Formula 13) and the compound expressed in Formula 5 in a weight, ratio of 1:10 was formed as the luminescent layer by means of co-vapor deposition by 50 nm. Then, the compound expressed in Formula 19 was formed thereon as the electron transporting layer by employing the vacuum vapor deposition method by 50 nm. Then, a magnesium-silver alloy was formed as the cathode to manufacture an organic EL device.

When a direct voltage of 10V was applied to this device, the luminance of 970 cd/m² was obtained.

Example 13

Another organic EL device was manufactured in accordance with the same procedure of Example 12 except that the compound expressed in Formula 6 was employed in place of that expressed in Formula 5. When a direct voltage of 10V was applied to this device, the luminance of 2200 cd/m² was obtained.

Example 14

A film made of ITO was so sputtered on a glass substrate 11 that a sheet resistance became to 20 Ω/□ to make the anode. On the anode, the luminescent layer was formed by means of a spin coat method employing a chloroform solution containing the compound expressed in Formula 10 and N,N'-diphenyl-N,N'-bis(1-naphthyl)-1,1'-biphenyl-4,4'-diamine-(Formula 13) in a molar ratio of 1:10. Then, the compound expressed in Formula 20 was formed thereon as the electron transporting layer by employing the vacuum vapor deposition method by 50 nm. Then, a magnesium-silver alloy was formed thereon as the cathode by employing the vacuum vapor deposition method by 200 nm to manufacture an organic EL device. When a direct voltage of 10V was applied to this device, the luminance of 1300 cd/m² was obtained.

Example 15

A sectional structure of a device employed in Example 15 is shown in FIG. 3. The device is composed of an anode 12, a hole transporting layer, a luminescent layer 14 and a cathode 16. A film made of ITO was so sputtered on a glass substrate 11 that a sheet resistance became to 20 Ω/□ to make the anode 12. On the anode, N,N'-diphenyl-N,N'-bis(1-naphthyl)-1,1'-biphenyl-4,4'-diamine (Formula 13) was formed as the hole transporting layer by means of a vacuum vapor deposition method by 50 nm. A mixed film made of the compound expressed in Formula 21 and the compound expressed in Formula 5 in a weight ratio of 20:1 was formed as the luminescent layer by means of co-vapor deposition by 50 nm. Then, a magnesium-silver alloy was formed as the cathode by 200 nm to manufacture an organic EL device. When a direct voltage of 10V was applied to this device, the luminance of 1150 cd/m² was obtained.

Example 16

Another organic EL device was manufactured in accordance with the same procedure of Example 15 except that a film having a thickness of 50 nm prepared by vacuum co-vapor deposition employing the compound expressed in Formula 21 and the compound expressed in Formula 6 in a weight ratio of 20:1 was employed as the luminescent layer. When a direct voltage of 10V was applied to this device, the luminance of 2100 cd/m² was obtained.

Example 17

A further organic EL device was manufactured in accordance with the same procedure of Example 15 except that N,N'-diphenyl-N,N'-bis(3-methylphenyl)-1,1'-biphenyl-4,4'-diamine (Formula 12) was formed as the hole transporting layer, and a mixed film made of the compound expressed in Formula 23 and the compound expressed in Formula 5 in a weight ratio of 20:1 was formed as the luminescent layer by means of co-vapor deposition. When a direct voltage of 10V was applied to this device, the luminance of 3000 cd/m² was obtained.

Example 18

A still further organic EL device was manufactured in accordance with the same procedure of Example 15 except that the compound expressed in Formula 7 was employed as the hole transporting layer and the compound expressed in Formula 23 was employed as the luminescent layer. When a direct voltage of 10V was applied to this device, the luminance of 800 cd/m² was obtained.

Example 19

A still further organic EL device was manufactured in accordance with the same procedure of Example 18 except that the compound expressed in Formula 8 was employed as the hole transporting layer. When a direct voltage of 10V was applied to this device, the luminance of 930 cd/m² was obtained.

Example 20

A still further organic EL device was manufactured in accordance with the same procedure of Example 18 except that the compound expressed in Formula 9 was employed as the hole transporting layer. When a direct voltage of 10V was applied to this device, the luminance of 1300 cd/m² was obtained.

Example 21

A still further organic EL device was manufactured in accordance with the same procedure of Example 18 except that the compound expressed in Formula 10 was employed as the hole transporting layer. When a direct voltage of 10V was applied to this device, the luminance of 1800 cd/m² was obtained.

Example 22

A still further organic EL device was manufactured in accordance with the same procedure of Example 7 except that N,N'-diphenyl-N,N'-bis(1-naphthyl)-1,1'-biphenyl-4,4'-diamine (Formula 13), the compound expressed in Formula 23 and the compound expressed in Formula 5 were employed as the hole transporting layer, the luminescent layer and the electron transporting layer, respectively. When a direct voltage of 10V was applied to this device, the luminance of 890 cd/m² was obtained.

Example 23

A still further organic EL device was manufactured in accordance with the same procedure of Example 22 except that the compound expressed in Formula 6 was employed as the electron transporting layer. When a direct voltage of 10V was applied to this device, the luminance of 700 cd/m² was obtained.

Example 24

A still further organic EL device was manufactured in accordance with the same procedure of Example 22 except that the compound expressed in Formula 7 was employed as the electron transporting layer. When a direct voltage of 10V was applied to this device, the luminance of 680 cd/m² was obtained.

Example 25

A still further organic EL device was manufactured in accordance with the same procedure of Example 22 except that the compound expressed in Formula 8 was employed as the electron transporting layer. When a direct voltage of 10V was applied to this device, the luminance of 500 cd/m² was obtained.

Example 26

A still further organic EL device was manufactured in accordance with the same procedure of Example 22 except that the compound expressed in Formula 9 was employed as the electron transporting layer. When a direct voltage of 10V was applied to this device, the luminance of 400 cd/m² was obtained.

Example 27

An organic EL device was manufactured in accordance with the procedure of Example 1 except that the compound expressed in Formula 25 was employed in place of the compound expressed in Formula 5. When a direct voltage of 5V was applied to this device, the luminance of 30 cd/m² was obtained.

Example 28

Another organic EL device was manufactured in accordance with the same procedure of Example 27 except that the compound expressed in Formula 26 was employed. When a direct voltage of 5V was applied to this device, the luminance of 100 cd/m² was obtained.

Example 29

Another organic EL device was manufactured in accordance with the same procedure of Example 27 except that the compound expressed in Formula 27 was employed. When a direct voltage of 5V was applied to this device, the luminance of 140 cd/m² was obtained.

Example 30

A further organic EL device was manufactured in accordance with the same procedure of Example 27 except that the compound expressed in Formula 28 was employed. When a direct voltage of 5V was applied to this device, the luminance of 180 cd/m² was obtained.

Example 31

A still further organic EL device was manufactured in accordance with the same procedure of Example 27 except that the compound expressed in Formula 29 was employed. When a direct voltage of 5V was applied to this device, the luminance of 160 cd/m² was obtained.

Example 32

A still further organic EL device was manufactured in accordance with the same procedure of Example 27 except that the compound expressed in Formula 30 was employed. When a direct voltage of 5V was applied to this device, the luminance of 200 cd/m² was obtained.

Example 33

A still further organic EL device was manufactured in accordance with the same procedure of Example 6 except that the compound expressed in Formula 30 was employed in place of the compound expressed in Formula 5. When a direct voltage of 5V was applied to this device, the luminance of 100 cd/m² was obtained.

Example 34

A still further organic EL device was manufactured in accordance with the same procedure of Example 7 except that the compound expressed in Formula 25 was employed in place of the compound expressed in Formula 5. When a direct voltage of 10V was applied to this device, the luminance of 300 cd/m² was obtained.

Example 35

A still further organic EL device was manufactured in accordance with the same procedure of Example 34 except that the compound expressed in Formula 26 was employed as the luminescent material. When a direct voltage of 10V was applied to this device, the luminance of 130 cd/m² was obtained.

Example 36

A still further organic EL device was manufactured in accordance with the same procedure of Example 34 except that the compound expressed in Formula 27 was employed as the luminescent material. When a direct voltage of 10V was applied to this device, the luminance of 190 cd/m² was obtained.

Example 37

A still further organic EL device was manufactured in accordance with the same procedure of Example 34 except that the compound expressed in Formula 28 was employed as the luminescent material. When a direct voltage of 10V was applied to this device, the luminance of 250 cd/m² was obtained.

Example 38

A still further organic EL device was manufactured in accordance with the same procedure of Example 34 except that the compound expressed in Formula 29 was employed as the luminescent material. When a direct voltage of 10V was applied to this device, the luminance of 210 cd/m² was obtained.

Example 39

A still further organic EL device was manufactured in accordance with the same procedure of Example 34 except that the compound expressed in Formula 30 was employed as the luminescent material. When a direct voltage of 10V was applied to this device, the luminance of 210 cd/m² was obtained.

Example 40

A still further organic EL device was manufactured in accordance with the same procedure of Example 34 except that N,N'-diphenyl-N,N'-bis(1-naphthyl)-1,1'-biphenyl-4,4'-diamine (Formula 13) was formed as the hole transporting layer and bis[2-(4-t-butylphenyl)-1,3,4-oxadiazol]-m-phenylene (Formula 18) was formed as the electron transporting layer. When a direct voltage of 10V was applied to this device, the luminance of 1700 cd/m² was obtained.

Example 41

A still further organic EL device was manufactured in accordance with the same procedure of Example 34 except that the compound expressed in Formula 14 was employed as the hole transporting layer, the compound expressed in Formula 27 was employed as the luminescent layer, and the compound expressed in Formula 21 was employed as the electron transporting layer. When a direct voltage of 10V was applied to this device, the luminance of 2100 cd/m² was obtained.

Example 42

A still further organic EL device was manufactured in accordance with the same procedure of Example 34 except that the compound expressed in Formula 15 was employed as the hole transporting layer, the compound expressed in Formula 30 was employed as the luminescent layer, and the compound expressed in Formula 22 was employed as the electron transporting layer. When a direct voltage of 10V was applied to this device, the luminance of 4000 cd/m² was obtained.

Example 43

A still further organic EL device was manufactured in accordance with the same procedure of Example 12 except that the compound expressed in Formula 26 was employed in place of the compound expressed in Formula 5. When a direct voltage of 10V was applied to this device, the luminance of 900 cd/m² was obtained.

Example 44

A still further organic EL device was manufactured in accordance with the same procedure of Example 43 except that the compound expressed in Formula 27 was employed in place of the compound expressed in Formula 26. When a direct voltage of 10V was applied to this device, the luminance of 1300 cd/m² was obtained.

Example 45

A still further organic EL device was manufactured in accordance with the same procedure of Example 43 except that the compound expressed in Formula 30 was employed in place of the compound expressed in Formula 26. When a direct voltage of 10V was applied to this device, the luminance of 1800 cd/m² was obtained.

Example 46

A still further organic EL device was manufactured in accordance with the same procedure of Example 14 except that the compound expressed in Formula 30 was employed in place of the compound expressed in Formula 10. When a direct voltage of 10V was applied to this device, the luminance of 900 cd/m² was obtained.

Example 47

A still further organic EL device was manufactured in accordance with the same procedure of Example 15 except that the compound expressed in Formula 25 was employed in place of the compound expressed in Formula 5. When a direct voltage of 10V was applied to this device, the luminance of 800 cd/m² was obtained.

Example 48

A still further organic EL device was manufactured in accordance with the same procedure of Example 47 except that a film having a thickness of 50 nm prepared by vacuum co-vapor deposition employing the compound expressed in Formula 19 and the compound expressed in Formula 26 in a weight ratio of 20:1 was employed as the luminescent layer. When a direct voltage of 10V was applied to this device, the luminance of 1350 cd/m² was obtained.

Example 49

A still further organic EL device was manufactured in accordance with the same procedure of Example 17 except that the compound expressed in Formula 30 was employed in place of the compound expressed in Formula 5. When a direct voltage of 10V was applied to this device, the luminance of 1600 cd/m² was obtained.

Example 50

A still further organic EL device was manufactured in accordance with the same procedure of Example 15 except that the compound expressed in Formula 28 was employed as the hole transporting layer and the compound expressed in Formula 23 was employed as the luminescent layer. When a direct voltage of 10V was applied to this device, the luminance of 700 cd/m² was obtained.

Example 51

A still further organic EL device was manufactured in accordance with the same procedure of Example 50 except that the compound expressed in Formula 30 was employed as the hole transporting layer. When a direct voltage of 10V was applied to this device, the luminance of 950 cd/m² was obtained.

Example 52

A still further organic EL device was manufactured in accordance with the same procedure of Example 34 except that the compound expressed in Formula 25 was employed as the electron transporting layer and the compound expressed in Formula 21 was employed as the luminescent layer. When a direct voltage of 10V was applied to this device, the luminance of. 80 cd/m² was obtained.

Example 53

A still further organic EL device was manufactured in accordance with the same procedure of Example 1 except that the compound expressed in Formula 31 was employed in place of the compound expressed in Formula 5. When a direct voltage of 5V was applied to this device, the luminance of 40 cd/m² was obtained.

Example 54

A still further organic EL device was manufactured in accordance with the same procedure of Example 53 except that the compound expressed in Formula 32 was employed as the luminescent material. When a direct voltage of 5V was applied to this device, the luminance of 90 cd/m² was obtained.

Example 55

A still further organic EL device was manufactured in accordance with the same procedure of Example 53 except that the compound expressed in Formula 33 was employed as the luminescent material. When a direct voltage of 5V was applied to this device, the luminance of 130 cd/m² was obtained.

Example 56

A still further organic EL device was manufactured in accordance with the same procedure of Example 53 except that the compound expressed in Formula 34 was employed as the luminescent material. When a direct voltage of 5V was applied to this device, the luminance of 170 cd/m² was obtained.

Example 57

A still further organic EL device was manufactured in accordance with the same procedure of Example 53 except that the compound expressed in Formula 35 was employed as the luminescent material. When a direct voltage of 5V was applied to this device, the luminance of 150 cd/m² was obtained.

Example 58

A still further organic EL device was manufactured in accordance with the same procedure of Example 53 except that the compound expressed in Formula 36 was employed as the luminescent material. When a direct voltage of 5V was applied to this device, the luminance of 210 cd/m² was obtained.

Example 59

A still further organic EL device was manufactured in accordance with the same procedure of Example 6 except that the compound expressed in Formula 36 was employed in place of the compound expressed in Formula 5. When a direct voltage of 5V was applied to this device, the luminance of 110 cd/m² was obtained.

Example 60

A still further organic EL device was manufactured in accordance with the same procedure of Example 7 except that the compound expressed in Formula 31 was employed in place of the compound expressed in Formula 5. When a direct voltage of 10V was applied to this device, the luminance of 280 cd/m² was obtained.

Example 61

A still further organic EL device was manufactured in accordance with the same procedure of Example 60 except that the compound expressed in Formula 32 was employed as the luminescent material. When a direct voltage of 10V was applied to this device, the luminance of 135 cd/m² was obtained.

Example 62

A still further organic EL device was manufactured in accordance with the same procedure of Example 60 except that the compound expressed in Formula 33 was employed as the luminescent material. When a direct voltage of 10V was applied to this device, the luminance of 181 cd/m² was obtained.

Example 63

A still further organic EL device was manufactured in accordance with the same procedure of Example 60 except that the compound expressed in Formula 34 was employed as the luminescent material. When a direct voltage of 10V was applied to this device, the luminance of 248 cd/m² was obtained.

Example 64

A still further organic EL device was manufactured in accordance with the same procedure of Example 60 except that the compound expressed in Formula 35 was employed as the luminescent material. When a direct voltage of 10V was applied to this device, the luminance of 226 cd/m² was obtained.

Example 65

A still further organic EL device was manufactured in accordance with the same procedure of Example 60 except that the compound expressed in Formula 36 was employed as the luminescent material. When a direct voltage of 10V was applied to this device, the luminance of 214 cd/m² was obtained.

Example 66

A further organic EL device was manufactured in accordance with the same procedure of Example 60 except that N,N'-diphenyl-N,N'-bis(1-naphthyl)-1,1'-biphenyl-4,4'-diamine (Formula 13) was formed as the hole transporting layer and bis[2-(4-t-butylphenyl)-1,3,4-oxadiazol]-m-phenylene (Formula 18) was formed as the electron transporting layer. When a direct voltage of 10V was applied to this device, the luminance of 1670 cd/m² was obtained.

Example 67

A still further organic EL device was manufactured in accordance with the same procedure of Example 60 except that the compounds expressed in Formulae 14, 33 and 21 were employed as the hole transporting layer, the luminescent layer and the electron transporting layer, respectively. When a direct voltage of 10V was applied to this device, the luminance of 2190 cd/m² was obtained.

Example 68

A still further organic EL device was manufactured in accordance with the same procedure of Example 60 except that the compounds expressed in Formulae 15, 36 and 22 were employed as the hole transporting layer, the luminescent layer and the electron transporting layer, respectively. When a direct voltage of 10V was applied to this device, the luminance of 3970 cd/m² was obtained.

Example 69

A still further organic EL device was manufactured in accordance with the same procedure of Example 12 except that the compound expressed in Formula 32 was employed in place of the compound expressed in Formula 5. When a direct voltage of 10V was applied to this device, the luminance of 890 cd/m² was obtained.

Example 70

A still further organic EL device was manufactured in accordance with the same procedure of Example 69 except that the compound expressed in Formula 33 was employed in place of the compound expressed in Formula 32. When a direct-voltage of 10V was applied to this device, the luminance of 1260 cd/m² was obtained.

Example 71

A still further organic EL device was manufactured in accordance with the same procedure of Example 69 except that the compound expressed in Formula 36 was employed in place of the compound expressed in Formula 32. When a direct voltage of 10V was applied to this device, the luminance of 1820 cd/m² was obtained.

Example 72

A still further organic EL device was manufactured in accordance with the same procedure of Example 14 except that the compound expressed in Formula 36 was employed in place of the compound expressed in Formula 10. When a direct voltage of 10V was applied to this device, the luminance of 930 cd/m² was obtained.

Example 73

A still further organic EL device was manufactured in accordance with the same procedure of Example 15 except that the compound expressed in Formula 31 was employed in place of the compound expressed in Formula 5. When a direct voltage of 10V was applied to this device, the luminance of 820 cd/m² was obtained.

Example 74

A still further organic EL device was manufactured in accordance with the same procedure of Example 73 except that a film having a thickness of 50 nm prepared by vacuum co-vapor deposition employing the compounds expressed in Formulae 21 and 32 in a weight ratio of 20:1 was employed as the luminescent layer. When a direct voltage of 10V was applied to this device, the luminance of 1320 cd/m² was obtained.

Example 75

A further organic EL device was manufactured in accordance with the same procedure of Example 73 except that N,N'-diphenyl-N,N'-bis(3-methylphenyl)-1,1'-biphenyl-4,4'-diamine (Formula 12) was formed as the hole transporting layer, and a mixed film made of the compound expressed in Formula 23 and the compound expressed in Formula 36 in a weight ratio of 20:1 was formed as the luminescent layer by means of co-vapor deposition. When a direct voltage of 10V was applied to this device, the luminance of 1580 cd/m² was obtained.

Example 76

A further organic EL device was manufactured in accordance with the same procedure of Example 15 except that the compounds expressed in Formulae 34 and 23 were employed as the hole transporting layer and the luminescent layer, respectively. When a direct voltage of 10V was applied to this device, the luminance of 690 cd/m² was obtained.

Example 77

A further organic EL device was manufactured in accordance with the same procedure of Example 76 except that the compound expressed in Formula 36 was employed as the hole transporting layer. When a direct voltage of 10V was applied to this device, the luminance of 970 cd/m² was obtained.

Example 78

A further organic EL device was manufactured in accordance with the same procedure of Example 60 except that the compounds expressed in Formulae 31 and 21 were employed as the electron transporting layer and the luminescent layer, respectively. When a direct voltage of 10V was applied to this device, the luminance of 90 cd/m² was obtained.

Since the above embodiments are described only for examples, the present invention is not limited to the above embodiments and various modifications or alterations can be easily made therefrom by those skilled in the art without departing from the scope of the present invention.

What is claimed is:

1. An organic electroluminescent (EL) device comprising an anode, a cathode, and one or more organic thin film layers including a luminescent layer disposed between said anode and said cathode, at least one of said layers containing, in a form of a mixture or a single substance, a dibenzoperylene compound expressed in Formula (4):

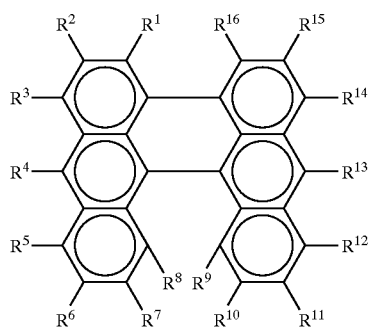

Formula (4)

wherein each of $R^1$ to $R^{16}$ independently represents a hydrogen atom, a halogen atom, a hydroxy group, a substituted or non-substituted amino group, nitro group or cyano group, a substituted or non-substituted alkyl group, a substituted or non-substituted alkenyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group; a substituted or non-substituted alkoxycarbonyl group, or a carboxyl group, and one or more pairs of substituents $R^1$ to $R^{16}$ may form a ring between two of them, provided $R^8$ and $R^9$ do not form a ring with each other, further wherein at least one of substituents $R^1$ to $R^{16}$ in Formula (4) represents a diarylamino group expressed by —$NAr^1Ar^2$, and each of $Ar_1$ and $Ar^2$ independently represents an aryl group having 6 to 20 carbons which may have one or more substituents, wherein the device has, as said organic thin film layer, at least a luminescent layer which includes the compound expressed in Formula (4) in a form of a mixture or a single substance, wherein at least one of substituents $R^1$ to $R^{16}$ in Formula (4) represents a diarylamino group expressed by —$NAr^1Ar^2$, and each of $Ar_1$ and $Ar^2$ independently represents an aryl group having 6 to 20 carbons which may have one or more substituents.

2. An organic electroluminescent (EL) device comprising an anode, a cathode, and one or more organic thin film layers including a luminescent layer disposed between said anode and said cathode, at least one of said layers containing, in a form of a mixture or a single substance, a dibenzoperylene compound expressed in Formula (4):

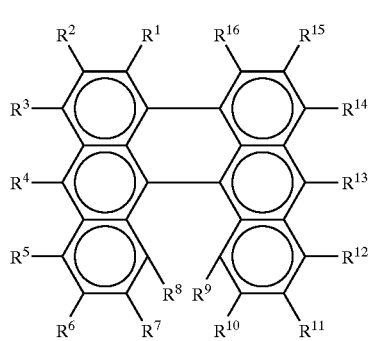

Formula (4)

wherein each of $R^1$ to $R^{16}$ independently represents a hydrogen atom, a halogen atom, a hydroxy group, a substituted or non-substituted amino group, nitro group or cyano group, a substituted or non-substituted alkyl group, a substituted or non-substituted alkyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxycarbonyl group, or a carboxyl group; and one or more pairs of substituents $R^1$ to $R^{16}$ may form a ring between two of them, provided $R^8$ and $R^9$ do not form a ring with each other, further wherein at least one of substituents $R^1$ and $R^{16}$ in Formula (4) represents a diarylamino group expressed by —$NAr^1Ar^2$, and each of $Ar^1$ and $Ar^2$ independently represents an aryl group having 6 to 20 carbons which may have one or more substituents,
wherein the device has, as said organic thin film layer, at least an electron transporting layer which includes the compound expressed in Formula (4) in a form of a mixture or a single substance, wherein at least one of substituents $R^1$ to $R^{16}$ in Formula (4) represents a diarylamino group expressed by —$NAr^1Ar^2$, and each of $Ar_1$ and Ar2 independently represents an aryl group having 6 to 20 carbons which may have one or more substituents.

3. The organic EL device as defined in claim 1, wherein at least one of substituents $R^1$ to $R^{16}$ in Formula (4) represents a diarylamino group expressed by —$NAr^1Ar^2$, each of $Ar_1$ and $Ar^2$ independently represents an aryl group having 6 to 20 carbons which may have one or more substituents and at least one of $Ar_1$ and $Ar^2$ has a substituted or non-substituted styryl group as a substituent.

4. The organic EL device as defined in claim 2, wherein at least one of substituents $R^1$ to $R^{16}$ in Formula (4) represents a diarylamino group expressed by —$NAr^1Ar^2$, each of $Ar_1$ and $Ar^2$ independently represents an aryl group having 6 to 20 carbons which may have one or more substituents and at least one of $Ar_1$ and Ar2 has a substituted or non-substituted styryl group as a substituent.

5. An organic electroluminescent (EL) device comprising an anode, a cathode, and one or more organic thin film layers including a luminescent layer disposed between said anode and said cathode, at least one of said layers containing, in a form of a mixture or a single substance, a dibenzoperylene compound expressed in Formula (4):

Formula (4)

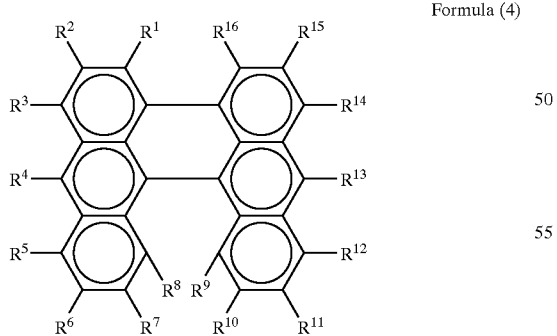

wherein each of $R^1$ to $R^{16}$ independently represents a hydrogen atom, a halogen atom, a hydroxy group, a substituted or non-substituted amino group, nitro group or cyano group, a substituted or non-substituted alkyl group, a substituted or non-substituted alkenyl group, a substituted or non-substituted cycloalkyl group, a substituted or non-substituted alkoxyl group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxycarbonyl group, or a carboxyl group; and one or more pairs of substituents $R^1$ to $R^{16}$ may form a ring between two of them, provided $R^8$ and $R^9$ do not form a ring with each other, wherein at least one of substituents $R^1$ to $R^{16}$ in Formula (4) represents a diarylamino group expressed by —$NAr^1Ar$, and each of $Ar_1$ and Ar2 independently represents an aryl group having 6 to 20 carbons which may have one or more substituents and only one or $Ar_1$ and $Ar^2$ has a substituted or non-substituted styryl group as a substituent, said organic thin film layer including a luminescent layer is at least a hole transporting layer which includes the compound expressed in Formula (4) in a form of a mixture or a single substance.

6. An organic electroluminescent (EL) device comprising an anode, a cathode, and one or more organic thin film layers including a luminescent layer disposed between said anode and said cathode, at least one of said layers containing, in a form of a mixture or a single substance, a dibenzoperylene compound expressed in Formula (4):

Formula (4)

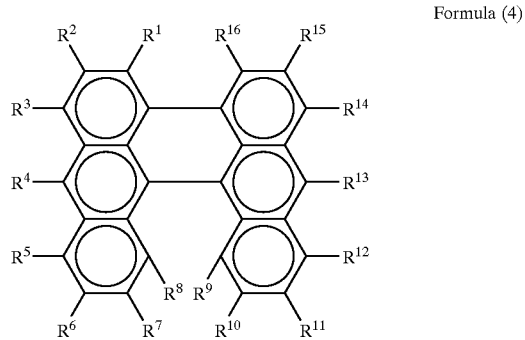

wherein each of $R^1$ to $R^{16}$ independently represents a hydrogen atom, a halogen atom, a hydroxy group, a substituted or non-substituted amino group, nitro group or cyano group, a substituted or non-substituted alkyl group, a substituted or non-substituted alkenyl group, a substituted or non-substituted cycloalkyl group, a substituted or non-substituted alkoxy group, a substituted or non-substituted aromatic hydrocarbon group, a substituted or non-substituted aromatic heterocyclic group, a substituted or non-substituted aralkyl group, a substituted or non-substituted aryloxy group, a substituted or non-substituted alkoxycarbonyl group, or a carboxyl group; and one or more pairs of substituents $R^1$ to $R^{16}$ may form a ring between two of them, provided $R^8$ and $R^9$ do not form a ring with each other, wherein at least one of substituents $R^1$ to $R^{16}$ in Formula (4) represents a diarylamino group expressed by —$NAr^1Ar^2$, and each of $Ar_1$ and $Ar^2$ independently represents an aryl group having 6 to 20 carbons which may have one or more substituents and only one of $Ar^2$ and $Ar^2$ has a substituted or non-substituted styryl group as a substituent.

* * * * *

UNITED STATES PATENT AND TRADEMARK OFFICE
CERTIFICATE OF CORRECTION

PATENT NO.    : 6,699,594 B1
DATED         : March 2, 2004
INVENTOR(S)   : Hitoshi Ishikawa et al.

It is certified that error appears in the above-identified patent and that said Letters Patent is hereby corrected as shown below:

Column 38,
Lines 33 and 41, delete "$Ar_1$" and insert -- $Ar^1$ --.

Column 39,
Line 2, delete "alkyl" and insert -- alkenyl --
Lines 24, 30 and 38, delete "$Ar_1$" and insert -- $Ar^1$ --.

Column 40,
Lines 13, 15 and 59, delete "$Ar_1$" and insert -- $Ar^1$ --.
Line 13, delete "Ar2" and insert -- $Ar^3$ --.
Line 61, delete "one of $Ar^2$" and insert -- one of $Ar^1$ --.

Signed and Sealed this

Thirteenth Day of July, 2004

JON W. DUDAS
*Acting Director of the United States Patent and Trademark Office*